United States Patent
Lai et al.

(10) Patent No.: US 8,928,616 B2
(45) Date of Patent: Jan. 6, 2015

(54) TOUCH ELECTRODE DEVICE

(71) Applicant: HengHao Technology Co. Ltd, Taoyuan County (TW)

(72) Inventors: Chien-Wen Lai, New Taipei (TW); Wei-Wen Wang, Taipei (TW)

(73) Assignee: HengHao Technology Co. Ltd., Pingjhen (TW)

(*) Notice: Subject to any disclaimer, the term of this patent is extended or adjusted under 35 U.S.C. 154(b) by 99 days.

(21) Appl. No.: 13/728,929

(22) Filed: Dec. 27, 2012

(65) Prior Publication Data

US 2014/0174799 A1 Jun. 26, 2014

(30) Foreign Application Priority Data

Dec. 20, 2012 (TW) .............................. 101148815 A

(51) Int. Cl.
*G06F 3/041* (2006.01)
*H05K 1/09* (2006.01)
*H05K 1/00* (2006.01)
*G06F 3/045* (2006.01)
*H05K 1/02* (2006.01)
*G06F 3/044* (2006.01)

(52) U.S. Cl.
CPC *H05K 1/02* (2013.01); *G06F 3/044* (2013.01); *H05K 1/09* (2013.01); *G06F 2203/04111* (2013.01)
USPC ............ 345/173; 174/257; 174/258; 345/174

(58) Field of Classification Search
USPC .......................... 174/257, 258; 345/173, 174
See application file for complete search history.

(56) References Cited

U.S. PATENT DOCUMENTS

| | | | |
|---|---|---|---|
| 2008/0264699 A1* | 10/2008 | Chang et al. | 178/18.01 |
| 2010/0073310 A1* | 3/2010 | Liang et al. | 345/173 |
| 2010/0171718 A1* | 7/2010 | Denda | 345/173 |
| 2010/0295819 A1* | 11/2010 | Ozeki et al. | 345/174 |
| 2011/0102370 A1* | 5/2011 | Kono et al. | 345/174 |
| 2011/0148780 A1* | 6/2011 | Lu et al. | 345/173 |
| 2012/0007827 A1* | 1/2012 | Lin et al. | 345/174 |
| 2012/0182230 A1* | 7/2012 | Wang et al. | 345/173 |
| 2012/0182250 A1* | 7/2012 | Nagata et al. | 345/173 |
| 2012/0319964 A1* | 12/2012 | Liu et al. | 345/173 |
| 2012/0325639 A1* | 12/2012 | Scuderi et al. | 200/600 |
| 2014/0071064 A1* | 3/2014 | Cho | 345/173 |

* cited by examiner

*Primary Examiner* — Timothy Thompson
*Assistant Examiner* — Sherman Ng
(74) *Attorney, Agent, or Firm* — Donald E. Stout; Stout, Uxa & Buyan, LLP

(57) ABSTRACT

A touch electrode device includes first electrode lines and second electrode lines formed on a transparent substrate. An insulating block is disposed at a junction between a first conductive connecting portion of the first electrode line and a second conductive connecting portion of the second electrode line. At least one insulating line is extended from the insulating block and disposed along the first electrode line.

12 Claims, 2 Drawing Sheets

TOUCH ELECTRODE DEVICE

CROSS-REFERENCE TO RELATED APPLICATIONS

The entire contents of Taiwan Patent Application No. 101148815, filed on Dec. 20, 2012, from which this application claims priority, are incorporated herein by reference.

BACKGROUND OF THE INVENTION

1. Field of the Invention

The present invention generally relates to a touch panel, and more particularly to a touch electrode device with insulating blocks and insulating lines.

2. Description of Related Art

A touch screen is an input/output device that adopts sensing technology and display technology, and has been widely employed in electronic devices such as portable or hand-held electronic devices.

A capacitor-based touch panel is a commonly used touch panel that utilizes capacitive coupling effect to detect touch position. Specifically, capacitance corresponding to the touch position changes and is thus detected, when a finger touches a surface of the touch panel.

FIG. 1 shows a top view of a conventional touch panel 200 disclosed in U.S. Pat. No. 6,188,391. The conventional touch panel 200 is composed of vertical electrode lines 21 and horizontal electrode lines 22. Elongated insulating blocks 23 are used to electrically insulate the vertical electrode lines 21 from the horizontal electrode lines 22. The width of the elongated blocks 23, however, is so wide that light transmittance of the touch panel 200 is disadvantageously reduced. Further, trace phenomenon may occur to impact visual appearance when users look at the touch panel 200.

A need has thus arisen to propose a novel touch electrode device to overcome deficiencies of the conventional touch panels.

SUMMARY OF THE INVENTION

In view of the foregoing, it is an object of the embodiment of the present invention to provide a touch electrode device to increase light transmittance and prevent trace phenomenon.

According to one embodiment, a touch electrode device includes a transparent substrate, a plurality of first electrode lines, a plurality of second electrode lines, a plurality of insulating blocks and a plurality of insulating lines. The first electrode lines are formed on the transparent substrate, each said first electrode including a plurality of first electrodes, a first conductive connecting portion being disposed between adjacent first electrodes of a same first electrode line. The second electrode lines are formed on the transparent substrate, each said second electrode line including a plurality of second electrodes, a second conductive connecting portion, being disposed between adjacent second electrodes of a same second electrode line. The insulating blocks are disposed at junctions between the first conductive connecting portions and the second conductive connecting portions, respectively. At least one of the insulating lines is extended from the insulating block along the first electrode line.

DETAILED DESCRIPTION OF THE INVENTION

Figure 2:
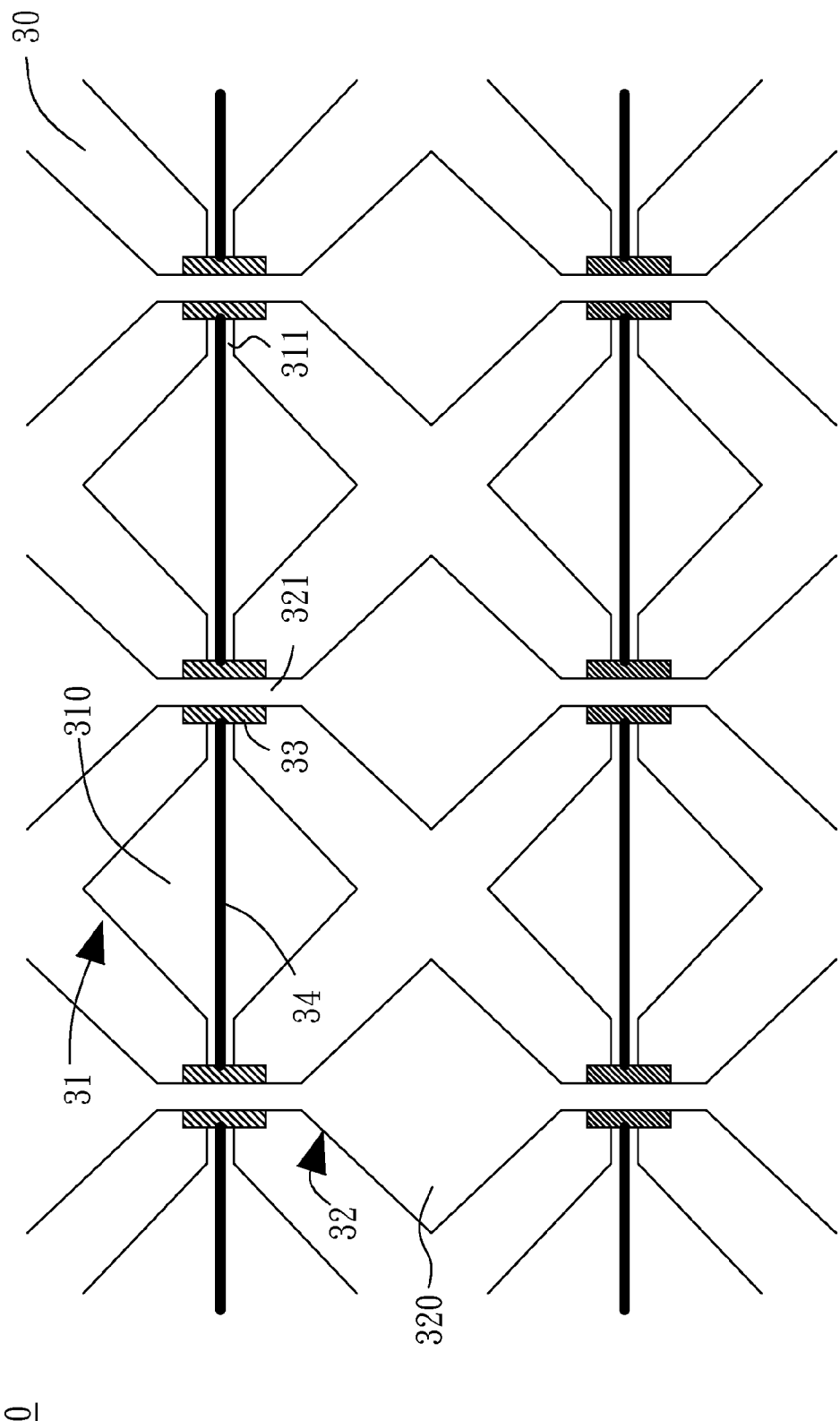
FIG. 2 shows a partial top view of a touch electrode device according to one embodiment of the present invention.

FIG. 2 shows a partial top view of a touch electrode device 300 according to one embodiment of the present invention. In the embodiment, the touch electrode device 300 mainly includes plural first electrode lines 31 and plural second electrode lines 32 formed on a transparent substrate 30. The first electrode lines 31 may be substantially parallel to each other, and the second electrode lines 32 may be substantially parallel to each other. The first electrode lines 31 may, but not necessarily, be substantially perpendicular to the second electrode lines 32. The transparent substrate 30 may include insulating material such as glass, Polycarbonate (PC), Polyethylene terephthalate (PET), Polyethylen (PE), Poly vinyl chloride (PVC), Poly propylene (PP), Poly styrene (PS), Polymethyl methacrylate (PMMA) or Cyclic olefin copolymer (COC).

In one embodiment, the first electrode line 31 and the second electrode line 32 may include a light-transmissive structure made of a non-transparent material. The non-transparent material may include metal nanowires (e.g., silver nanowires or copper nanowires) or metal nanonets (e.g., silver nanonets or copper nanonets). The metal nanowires or nanonets have a diameter in a nanometer order (i.e., a few nanometers to hundreds nanometers), and may be fixed in the first electrode line 31 and the second electrode line 32 via a plastic material (e.g., resin). Due to fineness of the metal nanowires/nanonets unobservable to human eyes, the first electrode line 31 and the second electrode line 32 made of the metal nanowires/nanonets thus have high light-transmittance. In another embodiment, the first electrode line 31 and the second electrode line 32 may further include a photosensitive material (e.g., acrylic), through which electrodes with a required pattern may be formed via an exposure development process.

In another embodiment, the first electrode line 31 and the second electrode line 32 may include a light-transmissive structure made of a transparent material. The transparent material may include indium tin oxide (ITO), indium zinc oxide (IZO), Al-doped ZnO (AZO) or antimony tin oxide (ATO).

The first electrode line 31 is composed of plural first electrodes 310. A first conductive connecting portion 311 is disposed, and electrically connected, between adjacent first electrodes 310 of the same first electrode line 31. The second electrode line 32 is composed of plural second electrodes 320. A second conductive connecting portion 321 is disposed, and electrically connected, between adjacent second electrodes 320 of the same second electrode line 32. The second conductive connecting portion 321 may include metal conductor. The first electrodes 310 and the second electrodes 320 may be designed to a shape other than the rhombus shape as exemplified in FIG. 2.

As shown in FIG. 2, an insulating block 33 is disposed at a junction between the first conductive connecting portion 311 of the first electrode line 31 and the second conductive connecting portion 321 of the second electrode line 32 in order to electrically insulate the first electrode line 31 from the second electrode line 32. In one embodiment, the insulating block 33 has a quadrilateral shape with each side of about 80-250 micrometers, and the first conductive connecting portion 311 and the second conductive connecting portion 321 have a width of about 40-80 micrometers.

Figure 1:
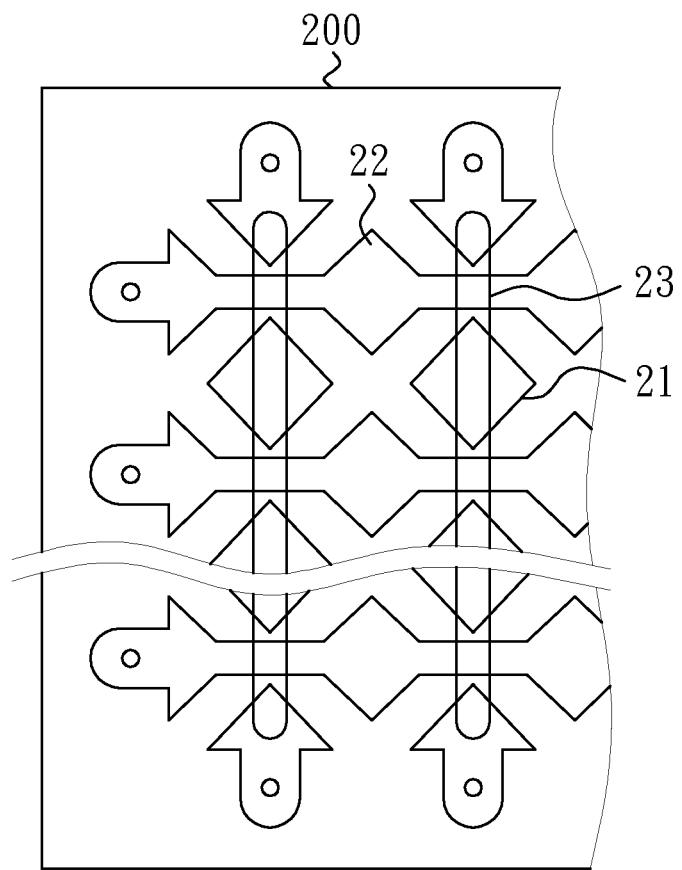
FIG. 1 shows a top view of a conventional touch panel.

According to one aspect of the embodiment, at least one insulating line 34 is extended from the insulating block 33 and disposed along the first electrode line 31. The insulating line 34 is encompassed within the corresponding first electrode 310 and the first conductive connecting portion 311. As exemplified in FIG. 2, one insulating line 34 corresponds to one first electrode line 31. The insulating line 34 has a width less than 40 micrometers, preferably less than 20 micrometers. In another embodiment, plural insulating lines 34 correspond to one first electrode line 31. The insulating lines 34 have a total width, including spacing therebetween, less than 40 micrometers, preferably less than 20 micrometers. Compared with the elongated insulating block (e.g., 23 in FIG. 1) of the conventional touch panel, the width of the insulating lines 34 is so narrow that the light transmittance of the touch panel cannot be impacted.

As shown in FIG. 2, the insulating blocks 33 and the insulating lines 34 may be integrally formed, or may be individually formed. In case that they are individually formed, the insulating blocks 33 may be formed before forming the insulating lines 34, or the insulating lines 34 may be formed before forming the insulating blocks 33. The insulating blocks 33 and the insulating lines 34 may include optically clear adhesive (OCA) or silicon dioxide. The insulating blocks 33 and the insulating lines 34 may further include a photosensitive material, through which a required pattern may be formed via an exposure development process.

Although specific embodiments have been illustrated and described, it will be appreciated by those skilled in the art that various modifications may be made without departing from the scope of the present invention, which is intended to be limited solely by the appended claims.

What is claimed is:

1. A touch electrode device, comprising:
   a transparent substrate;
   a plurality of first electrode lines formed on the transparent substrate, each said first electrode line including a plurality of first electrodes, a first conductive connecting portion being disposed between adjacent first electrodes of a same first electrode line;
   a plurality of second electrode lines formed on the transparent substrate, each said second electrode line including a plurality of second electrodes, a second conductive connecting portion being disposed between adjacent second electrodes of a same second electrode line;
   a plurality of insulating blocks disposed at junctions between the first conductive connecting portions and the second conductive connecting portions, respectively; and
   a plurality of insulating lines, each being extended from the insulating block along the first electrode line, and connecting two neighboring insulating blocks of the plurality of insulating blocks.

2. The device of claim 1, wherein the first electrode line or the second electrode line comprises a light-transmissive structure made of a non-transparent material.

3. The device of claim 2, wherein the non-transparent material comprises a plurality of metal nanowires or metal nanonets.

4. The device of claim 1, wherein the first electrode line or the second electrode line comprises a photosensitive material.

5. The device of claim 1, wherein the first electrode line or the second electrode line comprises a light-transmissive structure made of a transparent material.

6. The device of claim 5, wherein the transparent material comprises indium tin oxide (ITO), indium zinc oxide (IZO), Al-doped ZnO (AZO) or antimony tin oxide (ATO).

7. The device of claim 1, wherein the insulating block has a quadrilateral shape with each side of about 80-250 micrometers, and the first conductive connecting portion and the second conductive connecting portion have a width of about 40-80 micrometers.

8. The device of claim 1, wherein the at least one insulating line is encompassed within the corresponding first electrode and the first conductive connecting portion.

9. The device of claim 1, wherein one said insulating line corresponds to one said first electrode line, the insulating line having a width less than 40 micrometers.

10. The device of claim 1, wherein plural said insulating lines correspond to one said first electrode line, the plural insulating lines having a total width, including spacing therebetween, less than 40 micrometers.

11. The device of claim 1, wherein the insulating blocks or the insulating lines comprise optically clear adhesive (OCA) or silicon dioxide.

12. The device of claim 1, wherein the insulating blocks or the insulating lines comprise a photosensitive material.

* * * * *